United States Patent [19]

Maeda et al.

[11] Patent Number: 4,902,974

[45] Date of Patent: Feb. 20, 1990

[54] PHASE CORRECTING METHOD IN A MAGNETIC RESONANCE IMAGING SYSTEM AND DEVICE FOR REALIZING THE SAME

[75] Inventors: Akira Maeda, Machida; Koichi Sano, Sagamihara; Tetsuo Yokoyama, Tokyo, all of Japan

[73] Assignee: Hitachi, Ltd., Tokyo, Japan

[21] Appl. No.: 225,777

[22] Filed: Jul. 29, 1988

[30] Foreign Application Priority Data

Jul. 31, 1987 [JP] Japan .................................. 62-190019

[51] Int. Cl.$^4$ ........................................... G01R 33/20
[52] U.S. Cl. .................................................. 324/312
[58] Field of Search ................ 324/307, 309, 311, 312

[56] References Cited

U.S. PATENT DOCUMENTS 4,661,775  4/1987  Kormos et al. ...................... 324/312
4,720,679  1/1988  Patrick et al. ........................ 324/312

FOREIGN PATENT DOCUMENTS 0194338  8/1986  Japan .

OTHER PUBLICATIONS

Ahn et al., "A New Phase Correction Method ... Analysis", IEEE Transactions on Medical Imaging, Mar. 1987.

Borrello et al., "Chemical Shift-Based ... Images", Radiology, Aug. 1987.

Morishita et al., "Shingo Shori (Signal Processing)", 1987, pp. 160–165.

Primary Examiner—Michael J. Tokar
Assistant Examiner—Kevin D. O'Shea
Attorney, Agent, or Firm—Antonelli, Terry & Wands

[57] ABSTRACT

A magnetic resonance imaging method and a device for realizing the same for obtaining a magnetic resonance image having corrected phases, wherein the device comprises a construction for generating a static magnetic field, gradient magnetic fields and a radio-frequency magnetic field, irradiating an object to be tested with these magnetic fields and detecting nuclear magnetic resonance signals coming from the object to be tested; a sequence-controlling portion controlling the irradiation of the object to be tested with the gradient magnetic fields and the radio-frequency magnetic field and the detection of the nuclear magnetic resonance signals; and a processing device for reconstructing complex image data on the basis of the nuclear magnetic resonance signals thus detected. This processing device removes noise components by making complex image data signals pass through a low frequency filter after forming the even-number-th power thereof; assumes the phase distortions of the complex image data; corrects the complex image data on the basis of assumption results thus obtained; and synthesizing and displaying the magnetic resonance image on the basis of the corrected complex image data.

7 Claims, 3 Drawing Sheets

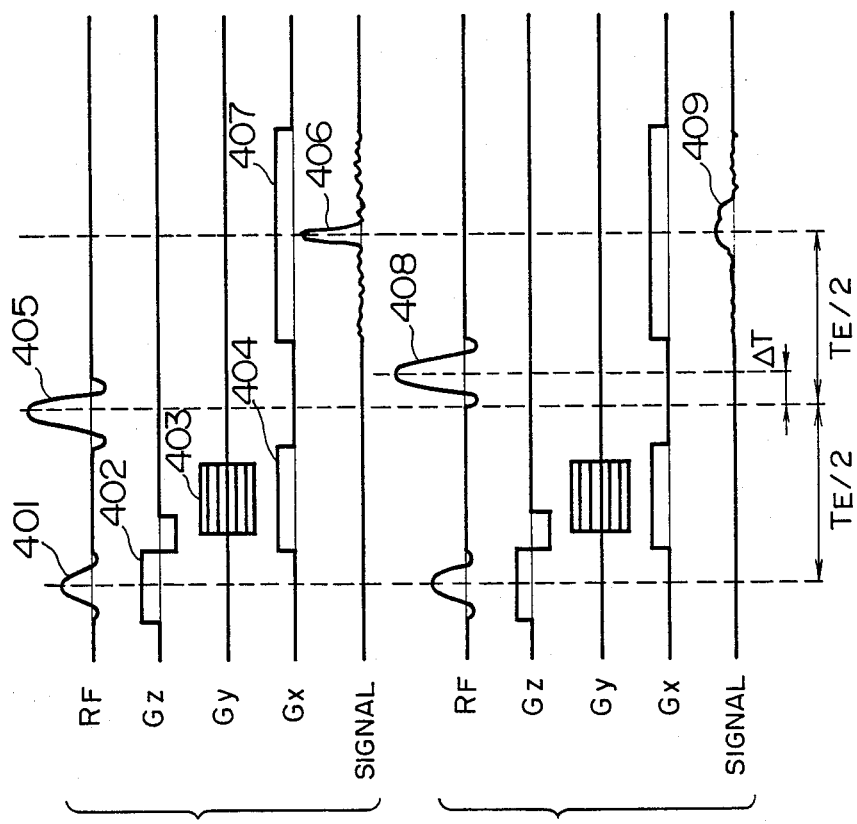

PHASE CORRECTING METHOD IN A MAGNETIC RESONANCE IMAGING SYSTEM AND DEVICE FOR REALIZING THE SAME

BACKGROUND OF THE INVENTION

This invention relates to a phase correcting method in a magnetic resonance imaging system and a device for realizing the same and in particular to a method for correcting phase distortions in tomographic data obtained in a tomographic system for a living body utilizing magnetic resonance phenomena and a device for realizing the same.

In general, in a magnetic resonance imaging system (hereinbelow abbreviated to MRI system) a living body is irradiated with a static magnetic field, a radio-frequency magnetic field and gradient magnetic fields and these magnetic fields fluctuate in position and in time with respect to the magnetic fields, with which the living body is to be irradiated ideally. Because of these fluctuations data of each pixel in a tomographic image detected by means of an MRI system contain phase distortions.

Heretofore, as a method for correcting phase distortions depending on the position in a tomographic image obtained by means of an MRI system there is known a method, by which phase distortions are obtained previously by calculation, starting from an image obtained by imaging a uniform body called a phantom under the same conditions as those used for a tomographic imaging by means of the MRI system and phase distortions in a tomographic image are corrected by using the calculated phase distortions thus obtained.

Since the phase distortions fluctuate in time and further they fluctuate also depending on the imaging procedure, the position of the tomographic image, etc., in order to correct the phase distortions with a high precision, there are problems that it is necessary to obtain frequently tomographic images of the phantom stated above, which takes a lot of time, and that operations of the MRI device are complicated.

As a method for correcting the phase distortions, using only data of obtained tomographic images, a method for correcting them by operations of absolute values is widely utilized. This method is disclosed e.g. in Ahn et al. "A New Phase Correction Method in NMR Imaging Based On Autocorrelation And Histogram Analysis" IEEE Transactions on Medical Imaging, Vol. MI-6, No. 1, 1987, pp 32-36. This method had a problem that, in the case where an imaging procedure, by which images where there exist originally mixedly positive and negative data are obtained, are used, such as the inversion recovery method (IR method), sign information is lost by the operations of absolute values.

SUMMARY OF THE INVENTION

The object of this invention is to provide a method capable of resolving the problems described above and correcting phase distortions with a high precision by using only data of tomographic images obtained by an arbitrary imaging procedure including the IR method.

The above object is achieved by multiplying at first a phase of each of pixels in a reconstructed tomographic image by an even number, calculating the phase angle at the position of each of the pixels after having made a low frequency filter act on the result thus obtained, then effecting a phase unwrapping treatment on these phase angle data so as to assume phase distortions and finally correcting the phase distortions in the original reconstructed complex image by using assumed results.

BRIEF DESCRIPTION OF THE DRAWINGS

FIGS. 3, 4A and 4B show pulse sequencies indicating the imaging procedure.

DESCRIPTION OF THE PREFERRED EMBODIMENTS

Figure 1:
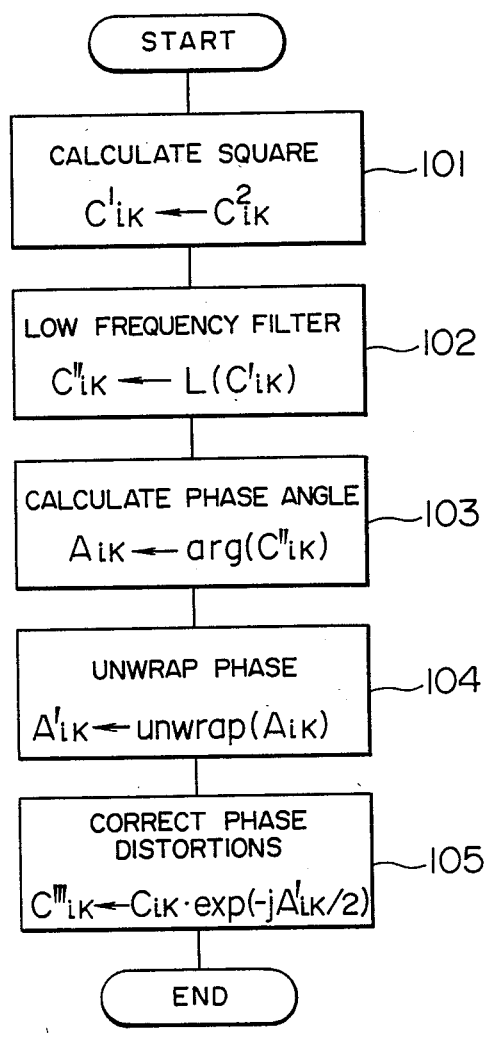
FIG. 1 is a flow chart for the treatment in one embodiment of this invention.
Figure 2:
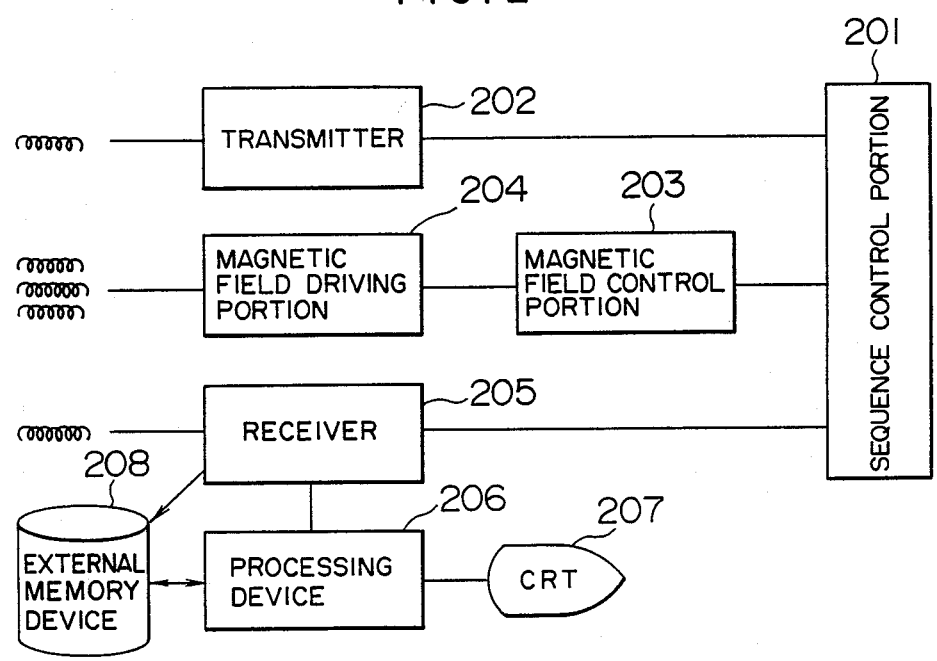
FIG. 2 is a block diagram illustrating the construction of an MRI device.

FIG. 2 is a block diagram illustrating the construction of an MRI device for realizing this invention. The MRI device consists of a sequence control portion controlling various parts of the device according to a predetermined procedure in order to detect magnetic resonance signals coming from an object to be tested, a transmitter 202 for transmitting high frequency magnetic field pulses generated for causing a resonance, a gradient magnetic field driving portion 204 driving gradient magnetic fields and a magnetic field control portion 203 for controlling them, a receiver 205 for receiving and detecting the magnetic resonance signals generated by the object to be tested, a processing device 206 carrying out various kinds of operations including reconstruction of images and phase distortion correcting process as described in connection with the flow chart of FIG. 1 including means to effect reconstruction of complex image data, operations including multiplication of the phase angle of the complex image data, assumption of phase distortions including filtering and unwrapping treatment, and corrections of the complex image data including dividing of data of phase angles, a CRT display device 207 for displaying images, and an external memory device 208 storing detected signal data, reconstructed image data, etc.

Figure 3:
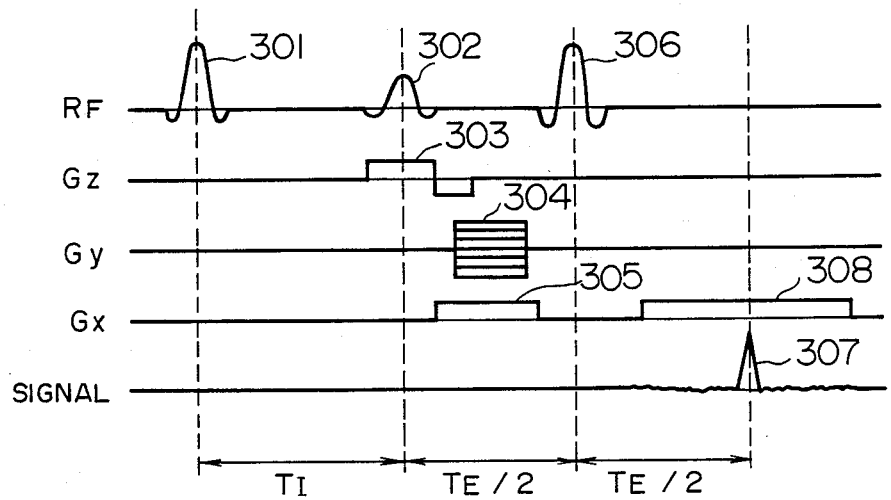

FIGS. 3 and 4 show sequences of an embodiment of this invention using the construction described above. FIG. 3 shows a sequence for obtaining a tomographic image by the IR method. At first the direction of spins in a domain to be tested is inverted by irradiating them with a 180° radio frequency pulse 301. After the time interval $T_I$ they are irradiated with a 90° radio-frequency magnetic field pulse 302.

Together with a Z-direction gradient magnetic field pulse 303 so that the spins within a slice to be imaged are made to resonate. Then, after they have been irradiated with a y-direction gradient magnetic field pulse 304 (phase encoding pulse) and an x-direction gradient magnetic field pulse 305, they are irradiated with a 180° radio-frequency magnetic field pulse 306 for generating a spin echo. A spin echo signal 307 generated in this way is measured while irradiating them with an x-direction gradient magnetic field pulse 308. This sequence is repeated while varying the intensity of the phase encoding pulse. The measurement result thus obtained is stored in the external memory device 208 and Fourier-transformed by the processing device 206 so as to reconstruct the tomographic image.

It is known that data of each pixel in the image reconstructed on the basis of data obtained by the sequence indicated in FIG. 3 may be both positive and negative, depending on the value of the parameter $T_1$ called the spin-lattice relaxation time of the object to be tested and a time interval $T_I$ shown in FIG. 3. According to this invention, it is possible to correct phase distortions by the method described later, even if there are positive and negative image data.

FIGS. 4A and 4B show an example of the sequence for obtaining a chemical shift image. The sequence indicated in FIG. 4A is one obtained by removing the 180° radio frequency magnetic field pulse 301 from the sequence indicated in FIG. 3. The object to be tested is irradiated with the 90° radio frequency magnetic field pulse 401, the z-direction gradient magnetic field pulse 402, the y-direction gradient magnetic field pulse (phase encoding pulse) 403, the x-direction gradient magnetic field pulse 404, the radio-frequency magnetic field pulse 405, and the x-direction gradient magnetic field pulse 407 in the order indicated in the figure and the spin echo signal 406 is measured. The sequence indicated in FIG. 4B differs from that indicated in FIG. 4A in that the timing of the irradiation with the 180° radio-frequency for the former is shifted by $\Delta T$ with respect to that for the latter. The value of the reconstructed image obtained by using the sequence indicated in FIG. 4A is proportional to the density of (water) + (fat). In the reconstructed image obtained by using the sequence indicated in FIG. 4B, it is known that, since there exists a chemical shift of about 3.4 ppm between water and fat, when $\Delta T$ is suitably chosen, the phase due to water is opposite to that due to fat and that in this way it is possible to obtain a reconstructed image having a value, which is proportional to the density of (water) − (fat) by detecting the signal at this time. It is possible to obtain a density image of water from the sum of these two images and that of fat from the difference therebetween. This is called the Dixon method and is described in an article entitled "Chemical Shift-Based True Water and Fat Images; Regional Phase Correction of Modified Spin-Echo MR Images" by Borrells et al., Radiology, August 1987, pp. 531–537. Here values of the image obtained by the sequence indicated in FIG. 4B can be positive and negative similarly to the case indicated in FIG. 3. According to this invention it is possible to correct phase distortions in the image data, even if the values of the signal are positive and negative.

Now the principle of this invention to correct phase distortions contained in the image reconstructed from the data having positive and negative values measured by the sequence indicated in FIGS. 3 or 4A and 4B will be explained.

Data of each pixel in an image obtained by measuring an object to be tested by means of an MRI device can be expressed as a complex number as follows:

$$C_{ik} = R_{ik} \cdot \exp(j\theta_{ik}) + n_{ik} \qquad (1)$$

where
$C_{ik}$: reconstructed complex image (complex number),
$R_{ik}$: real image to be obtained (real number),
$\theta_{ik}$: phase distortion (real number),
$n_{ik}$: noise (complex number).
$j = \sqrt{-1}$: imaginary unit,
and i, k: suffix representing the position of pixels.

Since the phase distortions are produced by non-uniformity of the static magnetic field, transient variations of the gradient magnetic field pulses, etc. it is possible to assume that they vary continuously and slowly with respect to the position in the image.

Representing the assumed value of a phase distortion $\theta_{ik}$ by $\bar{\theta}_{ik}$, the assumed value $\tilde{R}_{ik}$ of data of a pixel can be defined as follows:

$$\begin{aligned} \tilde{R}_{ik} &= C_{ik} \cdot \exp(-j\bar{\theta}_{ik}) \\ &= R_{ik} + n_{ik} \cdot \exp(-j\bar{\theta}_{ik}) \end{aligned} \qquad (2)$$

In the case where $R_{ik}$ takes only zero or positive values, since $\theta_{ik}$ varies sufficiently slowly in the image, if influences of the noise $n_{ik}$ by making a low frequency filter for removing noises act on $C_{ik}$, starting from Eq. (1), $$C_{ik(f)} \approx R_{ik(f)} \cdot \exp(j\theta_{ik})$$

can be obtained and thus the phase distortion $\theta_{ik}$ can be obtained easily with a high precision.

However, in the imaging procedure by the IR method indicated in FIG. 3 or the Dixon method indicated in FIG. 4, $R_{ik}$ takes positive and negative values. In this case Eq. (1) can be expressed as follows:

$$C_{ik} = |R_{ik}| \cdot \exp\{j(\theta_{ik} + \delta_{ik})\} + n_{ik} \qquad (3)$$

where if $R_{ik} \geq 0$, $\delta_{ik} = 0$ if $R_{ik} < 0$, $\delta_{ik} = \pi$ In this case $\delta_{ik}$ takes a value of 0 or $\pi$, depending on the sign of $R_{ik}$. For this reason the phase component $(\theta_{ik} + \delta_{ik})$ in Eq. (3) varies discontinuously at the parts where the sign of $R_{ik}$ changes. Therefore the assumption that the phase component varies slowly is no longer valid. Consequently, when a series of data including such discontinuous parts pass through the low frequency filter for removing noise, these discontinuous parts become dull and continuous, which give rise to significant errors in the assume value on the phase distortion in the neighborhood of these discontinuous parts. Furthermore, in the case where the phase distortion is assumed by using the value of $\theta_{ik} + \delta_{ik}$, another inconvenience that sign information of $R_{ik}$ is lost is produced.

By the method of this invention, at first the (even number)-th power of the reconstructed complex image data $C_{ik}$ is calculated, that is, $$C_{ik}^{2m} = R_{ik}^{2m} \exp(2mj\theta_{ik}) + \qquad (4)$$

(component depending on noises)

($m$: positive integer)

As it can be understood, since $R_{ik}^{2m}$ is the even-number-th power, it is always positive. Further, since the phase component is multiplied by the even number, it can be expressed by $2mj(\theta_{ik} + \delta_{ik})$ from Eq. (3). Since $\delta_{ik}$ is 0 or $\pi$, the term of $2m\delta_{ik}$ therein can be omitted and thus, finally, the phase component is expressed by $2mj\theta_{ik}$ as in Eq. (4). Therefore discontinuous variations in the phase disappear.

When the low frequency filter acts on the data $C_{ik}^{2m}$ expressed by Eq. (4), the component depending on noise is suppressed and the following equation is obtained:

$$C_{ik(f)}^{2m} \approx R_{ik}^{2m} \exp(2mj\theta_{ik})$$

In this way it is possible to assume the phase distortion $2m\theta_{ik}$, which has been multiplied by the even number. Since this phase distortion $2m\delta_{ik}$ multiplied by the even number is a slowly varying value both in position, a phase unwrapping treatment is effected thereon so that no discontinuous phase variations are produced. This phase unwrapping treatment is already well known e.g. by "Shingo Shori (Signal Processing)" by Morishita et al., 1987, pp. 160–165, edited by the Society of Instrument and Control Engineers of Japan. It is possible to assume the phase distortion $\bar{\theta}_{ik}$ of each pixel by dividing the phase distortion $2m\theta_{ik}$, which has been multiplied by an even number thus obtained, by 2m. In this way it is possible to assume the original pixel data $\bar{R}_{ik}$ by substituting this assume phase distortion for $\bar{\theta}_{ik}$ in Eq. (2).

In the case where corrections of phase distortions included in an image reconstructed on the basis of data measured by means of an MRI device are effected by a processing device 206, the correcting procedure therefor will be explained below, referring to the flow chart indicated in FIG. 1. This embodiment will be explained for the case where $C_{ik}$ is squared.

Step 101: Calculate an image $C'_{ik}$ obtained by squaring a reconstructed image $C_{ik}$ including phase distortions $= C_{ik}^2$.

Step 102: Make a low frequency filter act on $C'_{ik}$, i.e. form a simple average of $C'_{ik}$ of $(2n+1)^2$ pixels, which are n pixels above and below as well as on the left and right sides of the relevant pixel, respectively, using the following formula;

$$C'_{ik} = \sum_{l,m=-n}^{n} C_{i+l, k+m}/(2n+1)^2 \quad (5)$$

Step 103: Calculate from $C''_{ik}$ the phase angle $A_{ik}$ ($=2\theta_{ik}$) which is an even number multiple (which is 2 in this embodiment) of $\theta_{ik}$, using the following formula;

$$C'_{ik} = |C'_{ik}| \cdot \exp(jA_{ik}) \quad -\pi \leq A_{ik} < \pi \quad (6)$$

Step 104: Effect the phase unwrapping treatment on $A_{ik}$. The phase unwrapping treatment is a process for removing virtual discontinuities of the phase angle $A_{ik}$, which should vary originally smoothly on the image, at the value of $\pm\pi$ according to the definition of Eq. (6). For example the following procedure is carried out.

Now, for the sake of convenience, in order to choose the point, which is uppermost and outermost to the left, as the reference point, set $$A_{11}' = A_{11},$$

where $A_{11}'$ represents the value after having effected the unwrapping treatment on $A_{11}$. Next effect the unwrapping treatment on the pixels successively downward from the reference point.

for k=2, N $A'_{1k} = $ unwrap $(A_{1k}, A'_{1,k-1})$

This formula means that the data of $A'_{1k}$ are obtained by effecting the unwrapping treatment so that the phase $A_{1k}$ of the pixel, which is in the middle course of the treatment at that time, is made continuous with respect to the phase $A'_{1,k-1}$, which has been subjected to the directly preceding unwrapping treatment. When the unwrapping treatment described above is terminated, then effect the unwrapping treatment successively on the pixels to the right, using the outermost pixels to the left, which have been already subjected to the unwrapping treatment, as the starting point. The treatment proceeds from to the upper line to the lower one. That is, for k=1, N for i=2, N $A'_{ik} = $ unwrap $(A_{ik}, A'_{i-1,k})$ The unwrapping treatment is terminated by the process described above.

Here the function unwrap (a, b) is defined as follows:

$$\begin{aligned}\text{unwrap } (a, b) &= a - 2\pi^*[(a - b + \pi)/2\pi], \text{ if } a \geq b \\&= a + 2\pi^*[(b - a + \pi)/2\pi], \text{ if } a < b.\end{aligned}$$

where [] means a truncating operation by omitting the number below the decimal point and N represents the number of pixels in a line and also in a row.

Step 105: Correct the phase distortion, using the following formula:

$$C''_{ik} = C_{ik} \cdot \exp(-jA_{ik}'/2) \quad (7)$$

By the process described above it is possible to obtain the image $C'''_{ik}$, for which the phase distortions have been corrected.

Although the phase distortions are assumed by using a squared image in the above embodiment, this operation may be, in general, a formation of the even-number-th power. For example, if it is an operation to multiply only the phase angle by an even number, such as $C_{ik}^2/|C_{ik}|$, etc., it is obvious that an effect similar to that described above can be obtained. Further the effect remains unchanged, even if the window function multiplication in the frequency region of the data after a Fourier-transformation is utilized as an aspect of the low frequency filter. Furthermore it is a matter of course that an effect similar to that of this embodiment can be obtained by a sequence other than those indicated in FIGS. 3, 4A and 4B, if a reconstructed image having originally real values, unless there exist phase distortions, is obtained.

In addition, although the case where the spin echo signals are measured by using the 180° radio-frequency magnetic field pulse is described in the above embodiment, the method of this invention may be applied also to the case where the 180° radio-frequency magnetic field pulse is not used, but the echo signal (gradient echo) produced by the inversion of the gradient magnetic fields is measured. That is, it is known that non-uniformities of the static magnetic field are not compensated in the case of the gradient echo, but remarkable phase distortions arise on the image. It can be thought that also these phase distortions vary slowly in the image and it is possible to assume and correct the phase distortions by the method of this invention.

According to this invention, since it is possible to assume phase distortions with a high precision by using only image data, an effect can be obtained that it is possible to correct the phase distortions while maintaining sign information of the image data by a simple operation without lengthening the imaging time.

We claim:

1. A magnetic resonance imaging method for obtaining a magnetic resonance image having corrected phases comprising:
   a step of generating a static magnetic field, gradient magnetic fields and a radio-frequency magnetic field, irradiating an object to be tested therewith and detecting nuclear magnetic resonance signals having both positive and negative values coming from said object to be tested;
   a step of sequence-controlling the irradiation of said object to be tested with said gradient magnetic fields and said radio-frequency magnetic field and the detection of said nuclear magnetic resonance signals;
   a step of reconstructing complex image data on the basis of said nuclear magnetic resonance signals;
   an operating step of multiplying the phase angle of said complex image data thus reconstructed by an even number and obtaining operation results thereof;
   an assuming step of assuming phase distortions of said complex image data on the basis of the operation results of said operating step;
   a correcting step of correcting said complex image data on the basis of the assumptions of said assuming step; and
   a step of synthesizing and displaying the magnetic resonance image on the basis of said complex image data corrected in said correcting step.

2. A magnetic resonance imaging device for obtaining a magnetic resonance image having corrected phases comprising:
   means for generating a static magnetic field, gradiant magnetic fields and a radio-frequency magnetic field;
   means for irradiating an object to be tested therewith;
   detecting means for detecting nuclear magnetic resonance signals having both positive and negative values coming from said object to be tested;
   means for sequence-controlling the irradiation of said object to be tested with said gradient magnetic fields and said radio-frequency magnetic field generated by said means for generating said magnetic fields and the detection of said nuclear magnetic resonance signals;
   reconstructing means for reconstructing complex image data on the basis of said nuclear magnetic resonance signals detected by said detecting means;
   operating means for multiplying the phase angle of said complex image data thus reconstructed by said reconstructing means by an even number and obtaining operation results thereof;
   assuming means for assuming phase distortions of said complex image data on the basis of the operation results of said operating means;
   correcting means for correcting said complex image data on the basis of the assumptions of said assuming means; and
   means for synthesizing and displaying the magnetic resonance image on the basis of said complex image data corrected by said correcting means.

3. A magnetic resonance imaging device according to claim 2, wherein said operating means is means for forming the even-number-th power of said complex image data.

4. A magnetic resonance imaging device according to claim 2, wherein said assuming means includes a low frequency filter means for removing noise components from signals coming from said operating means and assumes the phase distortions of said complex image data on the basis of the signals having passed through said low frequency filter means.

5. A magnetic resonance imaging device according to claim 4, wherein said low frequency filter means is means for forming a simple average of the magnitude of said relevant complex image data and magnitudes of a plurality of complex image data close thereto.

6. A magnetic resonance imaging device according to claim 2, wherein said assuming means includes unwrapping treatment effecting means for effecting unwrapping treatment on data of each of the phase angles multiplied by the even number coming from said operating means.

7. A magnetic resonance imaging device according to claim 6, wherein said correcting means includes dividing means for dividing the data of each of the phase angles coming from said unwrapping treatment effecting means by said even number and means for obtaining complex image data having corrected phases on the basis of the phase angle data coming from said dividing means.

* * * * *